(12) United States Patent
Cheng et al.

(10) Patent No.: US 11,050,173 B2
(45) Date of Patent: Jun. 29, 2021

(54) ARRANGEMENT FOR LOWERING RESISTANCE ON POWER DELIEVERY REGION OF ELECTRICAL CONNECTOR

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Shan-Yong Cheng, New Taipei (TW); Chih-Hsien Chou, San Jose, CA (US); Fang-Jwu Liao, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/669,529

(22) Filed: Oct. 31, 2019

(65) Prior Publication Data
US 2020/0144747 A1    May 7, 2020

Related U.S. Application Data

(60) Provisional application No. 62/753,946, filed on Nov. 1, 2018.

(51) Int. Cl.
*H01R 13/46* (2006.01)
*H01R 12/71* (2011.01)
(Continued)

(52) U.S. Cl.
CPC ....... *H01R 12/714* (2013.01); *H01R 13/2457* (2013.01); *H01R 13/41* (2013.01);
(Continued)

(58) Field of Classification Search
CPC .... H01R 12/596; H01R 12/61; H01R 13/567; H01R 13/6471; H01R 13/6581;
(Continued)

(56) References Cited

U.S. PATENT DOCUMENTS 4,726,777 A * 2/1988 Billman ............... H05K 7/1038
29/842
5,145,387 A * 9/1992 Ichihashi ........... H01R 13/6474
439/108
(Continued)

*Primary Examiner* — Truc T Nguyen
(74) *Attorney, Agent, or Firm* — Ming Chieh Chang; Wei Te Chung

(57) ABSTRACT

An electrical connector includes an insulative housing forming plural rows of passageways wherein each row of passageways extends along a transverse direction while the plural rows are spaced from one another in a front-to-back direction perpendicular to the transverse direction. Each passageway is dimension to receive a unified contact having three sets of spring arms spaced from one another in the transverse direction. The three sets of spring arms are categorized with two outer sets and one inner set therebetween in the transverse direction. The pitch between the two neighboring sets of spring arms of each unified contact is essentially one half of the distance between one outer set of spring arms of one unified contact and another outer set of spring arms of the neighboring unified contact.

19 Claims, 24 Drawing Sheets

(51) Int. Cl.
*H01R 13/41* (2006.01)
*H01R 13/24* (2006.01)
*H05K 1/11* (2006.01)
*H05K 1/14* (2006.01)

(52) U.S. Cl.
CPC ............ *H01R 13/46* (2013.01); *H05K 1/113* (2013.01); *H05K 1/144* (2013.01); *H05K 2201/042* (2013.01); *H05K 2201/093* (2013.01); *H05K 2201/09418* (2013.01); *H05K 2201/1031* (2013.01)

(58) Field of Classification Search
CPC .......... H01R 13/6586; H01R 13/65914; H01R 13/6592; H01R 13/6596; H01R 2103/00; H01R 2107/00; H01R 24/22; H01R 24/50; H01R 24/542; H01R 24/60; H01R 24/64; H01R 31/065; H01R 4/02; H01R 9/03; H01R 9/2483
See application file for complete search history.

(56) References Cited

U.S. PATENT DOCUMENTS

| | | | |
|---|---|---|---|
| 7,390,195 B2 | 6/2008 | Hon Hai | |
| 7,427,203 B2 | 9/2008 | Hon Hai | |
| 7,972,144 B2 | 7/2011 | Hon Hai | |
| 7,988,501 B2 | 8/2011 | Hon Hai | |
| 2002/0068484 A1* | 6/2002 | Gutierrez | H01R 24/64 439/620.11 |
| 2010/0330844 A1* | 12/2010 | Ito | H01R 12/79 439/660 |
| 2011/0007238 A1* | 1/2011 | Kim | H05K 1/181 349/61 |
| 2014/0209370 A1* | 7/2014 | Minich | H05K 1/0245 174/266 |
| 2016/0284973 A1* | 9/2016 | Ohashi | H01L 41/1132 |
| 2018/0331035 A1* | 11/2018 | Zhang | H01L 23/66 |

* cited by examiner

ARRANGEMENT FOR LOWERING RESISTANCE ON POWER DELIEVERY REGION OF ELECTRICAL CONNECTOR

BACKGROUND OF THE DISCLOSURE

1. Field of the Disclosure

The present disclosure relates to an electrical connector assembly, and more particularly to an electrical connector including a power delivery region with arrangement for lowering contact resistance thereof.

2. Description of Related Arts

The electrical connector for mounting upon a printed circuit board includes a power delivery region. As shown in FIGS. 1-11 and an upper part of FIG. 23, the previous connector for power delivery includes plural rows of power contacts and plural rows of grounding contacts alternately arranged with each other in a transverse direction wherein each row of power contacts and each row of grounding contacts extend in a zigzag manner. Notably, each contact is arranged to be at the center of a hexagon of which the six corners are occupied by the corresponding six neighboring contacts. Understandably, the positions of the power contacts and grounding contacts are specifically arranged with one another for assuring the proper electrical characteristics of the contacts and the mechanical characteristics of the housing via the pitch and relative direction considerations. Anyhow, under the current arrangement the whole connector contact resistance is relatively high disadvantageously. The detailed descriptions are as follows. The electrical connector assembly 10 includes an electrical connector 100 sandwiched between a pair of printed circuit boards 200 which are opposite to each other in the vertical direction. The connector 100 includes an insulative housing 110 with a plurality of passageways 112 extending therethrough in the vertical direction Z. The passageways are arranged with a plurality of rows spaced from one another in the transverse direction X, and each row extends along a front-to-back direction Y in a zigzag manner. A plurality of contacts 120 are respectively received within the corresponding passageways 112. Each contact 120 has a vertical main body 122 with barbs 124 on two sides, and a pair of spring arm sets 126 respectively extending from two opposite upper and lower ends of the main body 122. Each of the printed circuit boards 200 includes five layers composed of the top/first insulative layer 202, a middle/second insulative layer 204 and a bottom/third insulative layer 206 wherein a metallic/conductive Vbus layer 208 is sandwiched between the top insulative layer 202 and the middle insulative layer 204, and a metallic/conductive grounding layer 210 is sandwiched between the middle insulative layer 204 and the bottom insulative layer 206. A plurality of conductive pads 220 are formed on the exterior surface of the top insulative layer 202 to contact the spring arm set 126 of the corresponding contact 120. A plurality of short vias 222 extend in the vertical direction to connect the conductive pads 220 and the Vbus layer 208. A plurality of long vias 224 extend in the vertical direction to connect the conductive pads 220 and the grounding layer 210. The V-bus layer 208 forms a plurality of through holes 209 to receive the corresponding protrusions 203 on the top insulative layer 202 wherein each protrusion 203 has the corresponding long vias 224 extend therethrough. Understandably, the protrusions 203 may be formed on the middle layer 204. The power contacts 120P and the grounding contacts 120G are alternately arranged with each other in both the front-to-back direction and the transverse direction. On one hand, the pitch P1 along the transverse direction between the neighboring contacts 120 of the first neighboring different rows, i.e., between one power contact 120P and one grounding contact 120G, which is one half of the pitch P2 along the transverse direction between the neighboring contacts 120 of the second different rows, i.e., between one power contact 120P and another power contact 120P. On the other hand, the pitch P3 along the transverse direction between the neighboring contacts 120 of the first neighboring different rows wherein the contacts 120 are offset from each other in the front-to-back direction, is one half of the pitch 1.

An improved electrical connector with the lower contact resistance is desired.

SUMMARY OF THE DISCLOSURE

An object of the invention is to provide a power delivery connector with an arrangement of the corresponding power contacts and grounding contacts in a relatively densely manner for not only lowering the contact resistance but also maintaining the required solid structure of the housing.

To achieve the above object, an electrical connector includes an insulative housing forming plural rows of passageways wherein each row of passageways extends along a transverse direction while the plural rows are spaced from one another in a front-to-back direction perpendicular to the transverse direction. Each passageway is dimension to receive a unified contact having three sets of spring arms spaced from one another in the transverse direction. The three sets of spring arms are categorized with two outer sets and one inner set therebetween in the transverse direction. The pitch between the two neighboring sets of spring arms of each unified contact is essentially one half of the distance between one outer set of spring arms of one unified contact and another outer set of spring arms of the neighboring unified contact. The corresponding printed circuit board includes five layer essentially composed of the top/first insulative layer, a middle/second insulative layer and a bottom/third insulative layer wherein a metallic/conductive Vbus layer is sandwiched between the top insulative layer and the middle insulative layer, and a metallic/conductive grounding layer is sandwiched between the middle insulative layer and the bottom insulative layer. A plurality of conductive pads are formed on an exterior surface of the top insulative layer corresponding to the contacts, a plurality of short vias extend through the top insulative layer to connect the corresponding conductive pads and the Vbus layer, and a plurality of long vias extend through both the top insulative layer and the middle insulative layer to connect the corresponding conductive pads to the grounding layer. Dimensionally and geometrically, compared with the previous connector assembly, the instant invention provides the three-in-one unified structure to lower the contact resistance and increase the power delivery capacity while still maintain the required isolation both mechanically and electrically between the power contacts and the grounding contacts advantageously.

Other objects, advantages and novel features of the disclosure will become more apparent from the following detailed description when taken in conjunction with the accompanying drawings.

DETAILED DESCRIPTION OF THE PREFERRED EMBODIMENT

Figure 1:
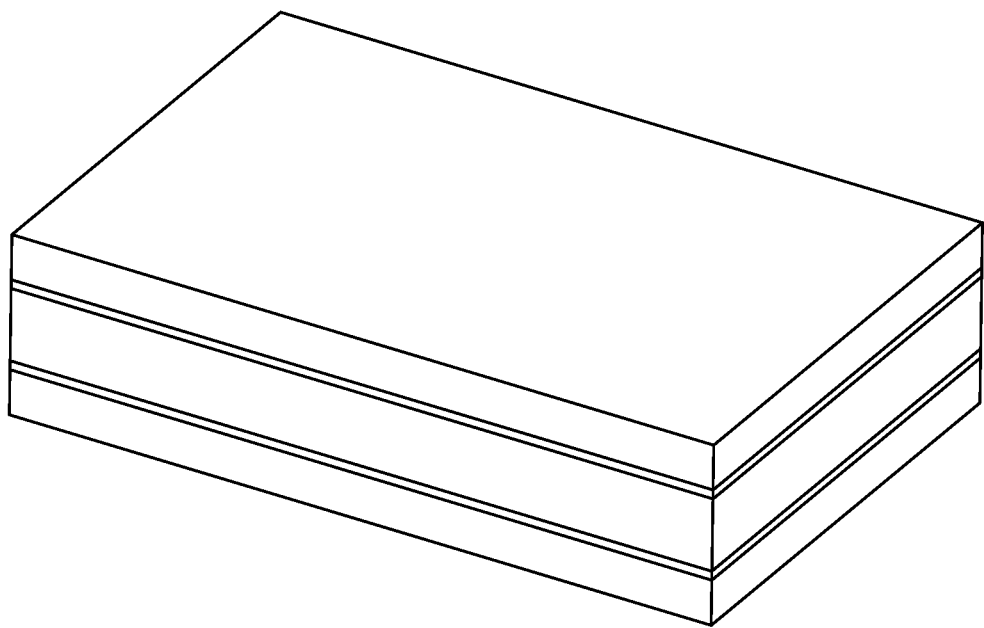
FIG. 1 is a perspective view of a printed circuit board of the previous type.
Figure 2:
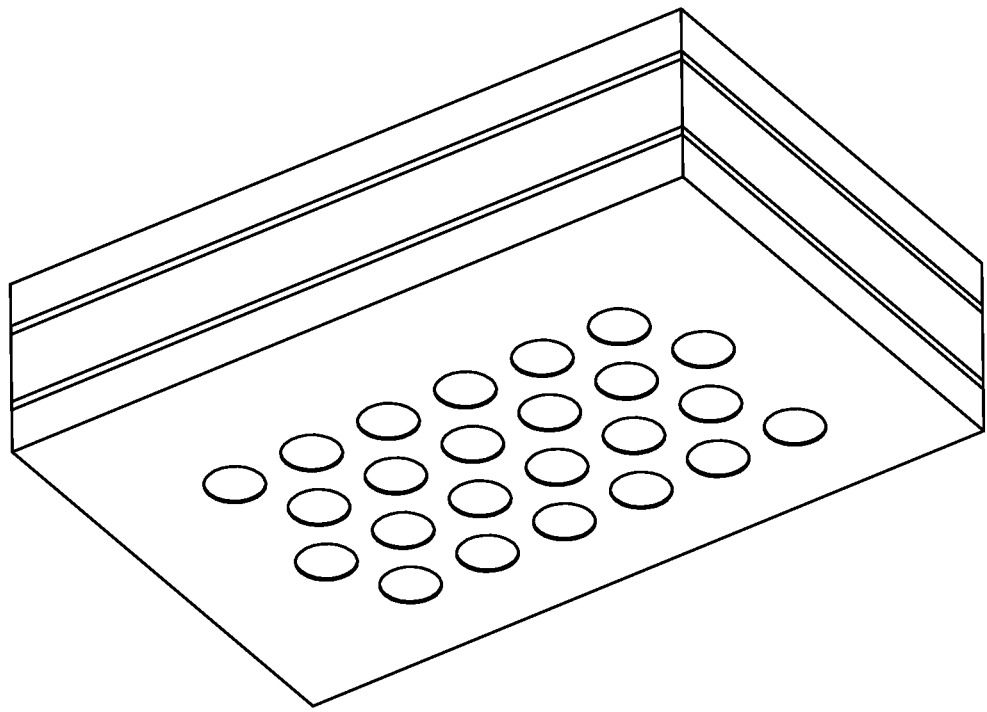
FIG. 2 is another perspective view of the printed circuit board of FIG. 1.
Figure 3:
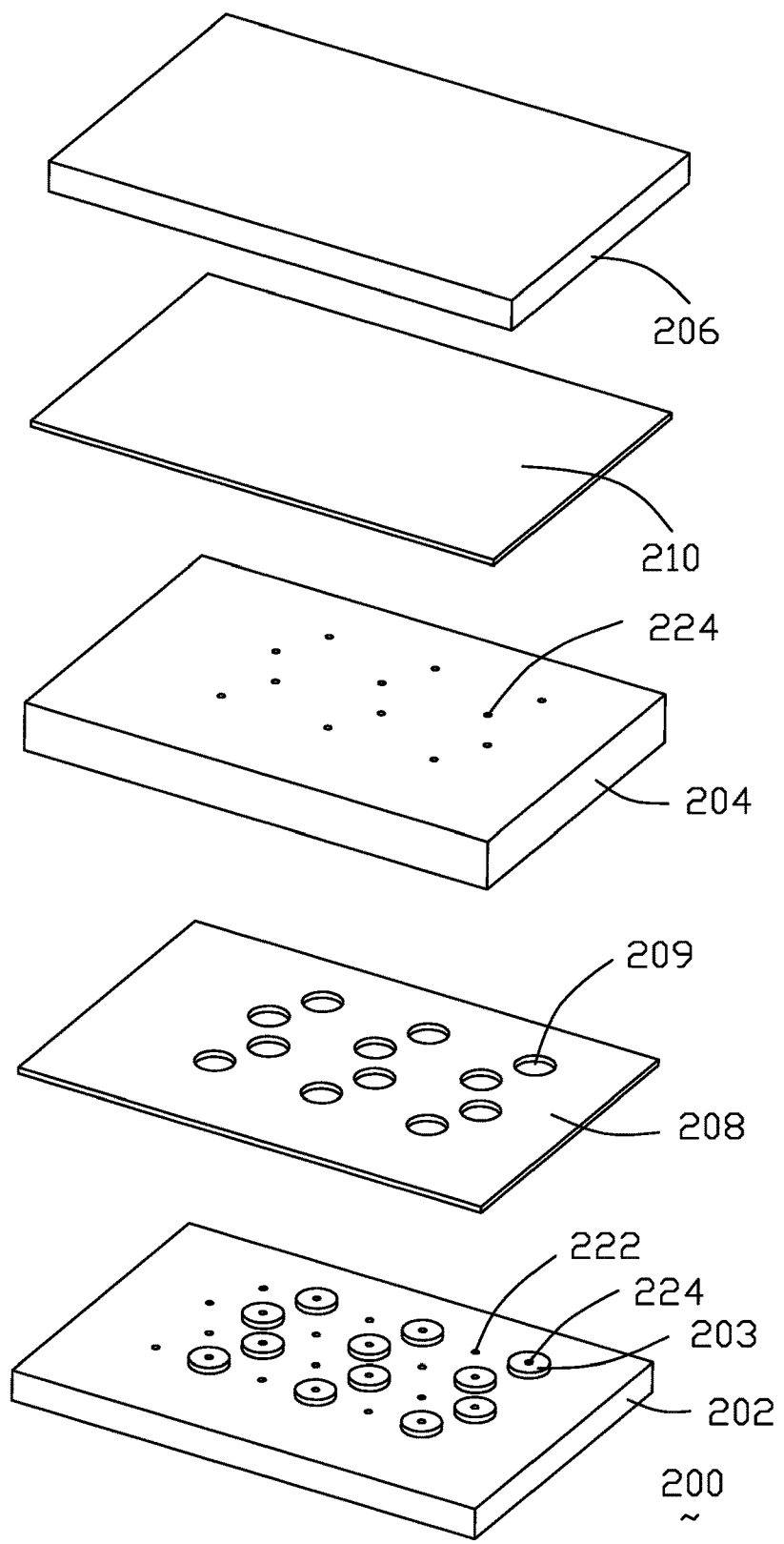
FIG. 3 is an exploded perspective view of the printed circuit board of FIG. 1.
Figure 4:
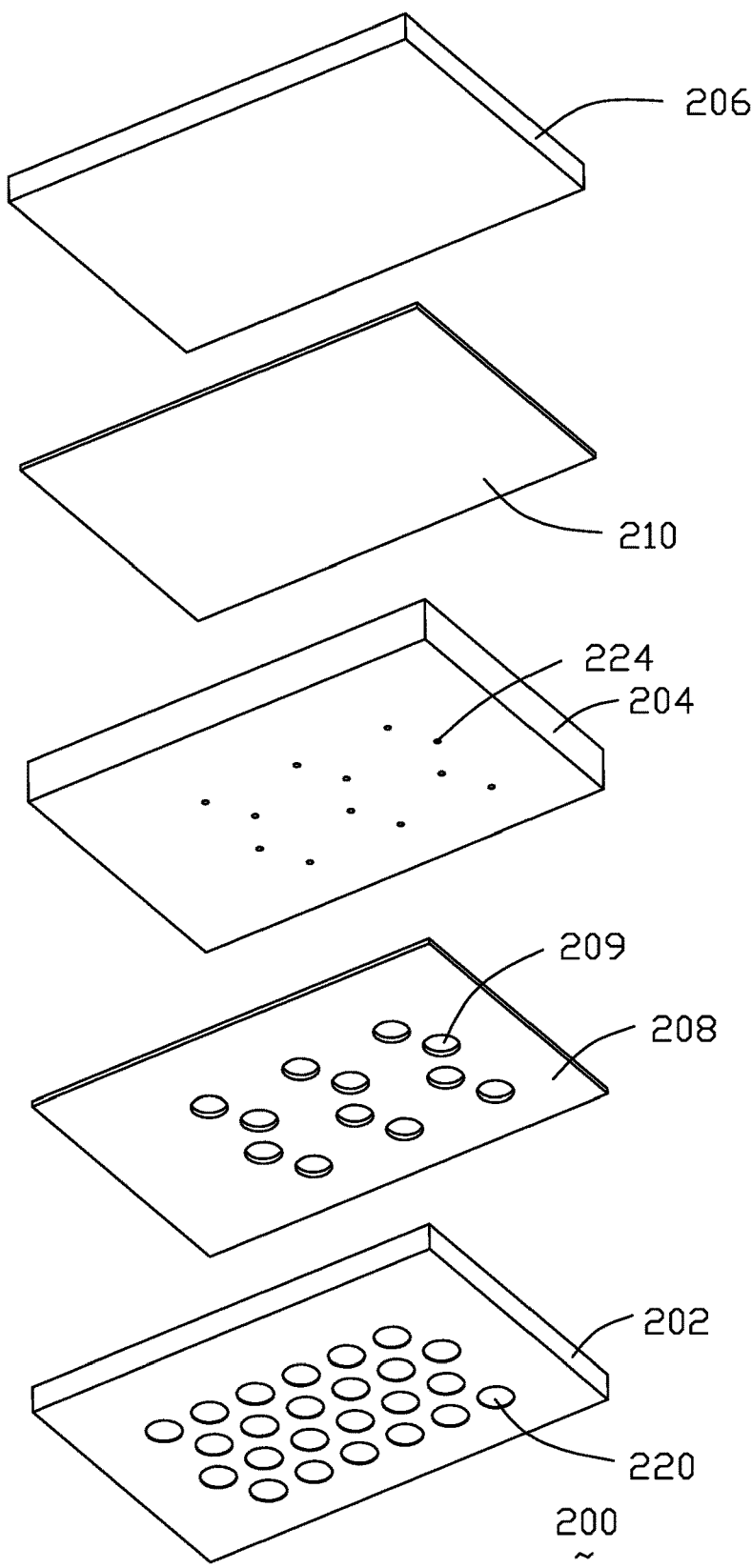
FIG. 4 is another exploded perspective view of the printed circuit board of FIG. 2.
Figure 5:
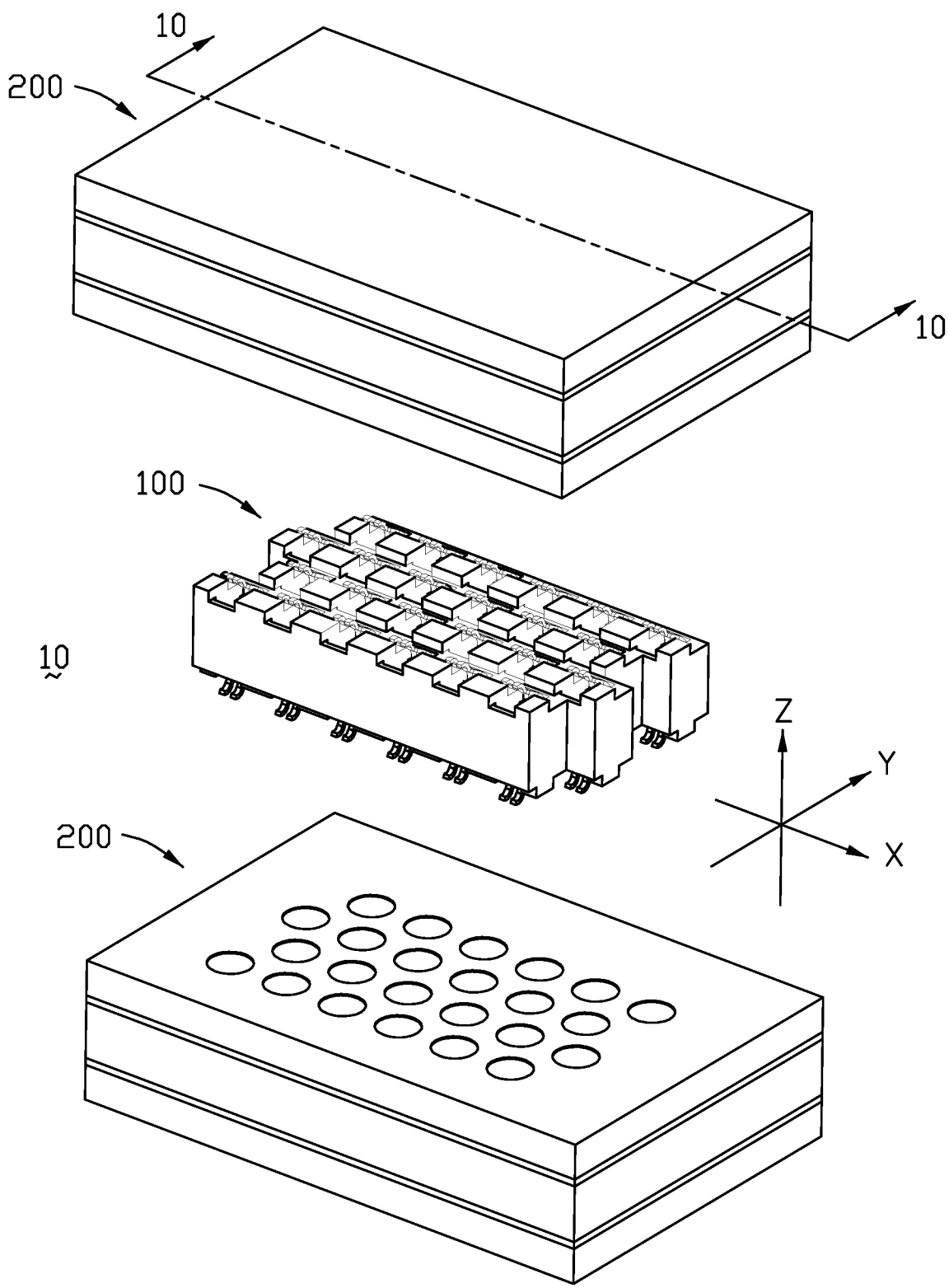
FIG. 5 is an exploded perspective view of the electrical connector assembly including two printed circuit boards of FIG. 1 with an electrical connector of the previous type sandwiched therebetween in the vertical direction.
Figure 6:
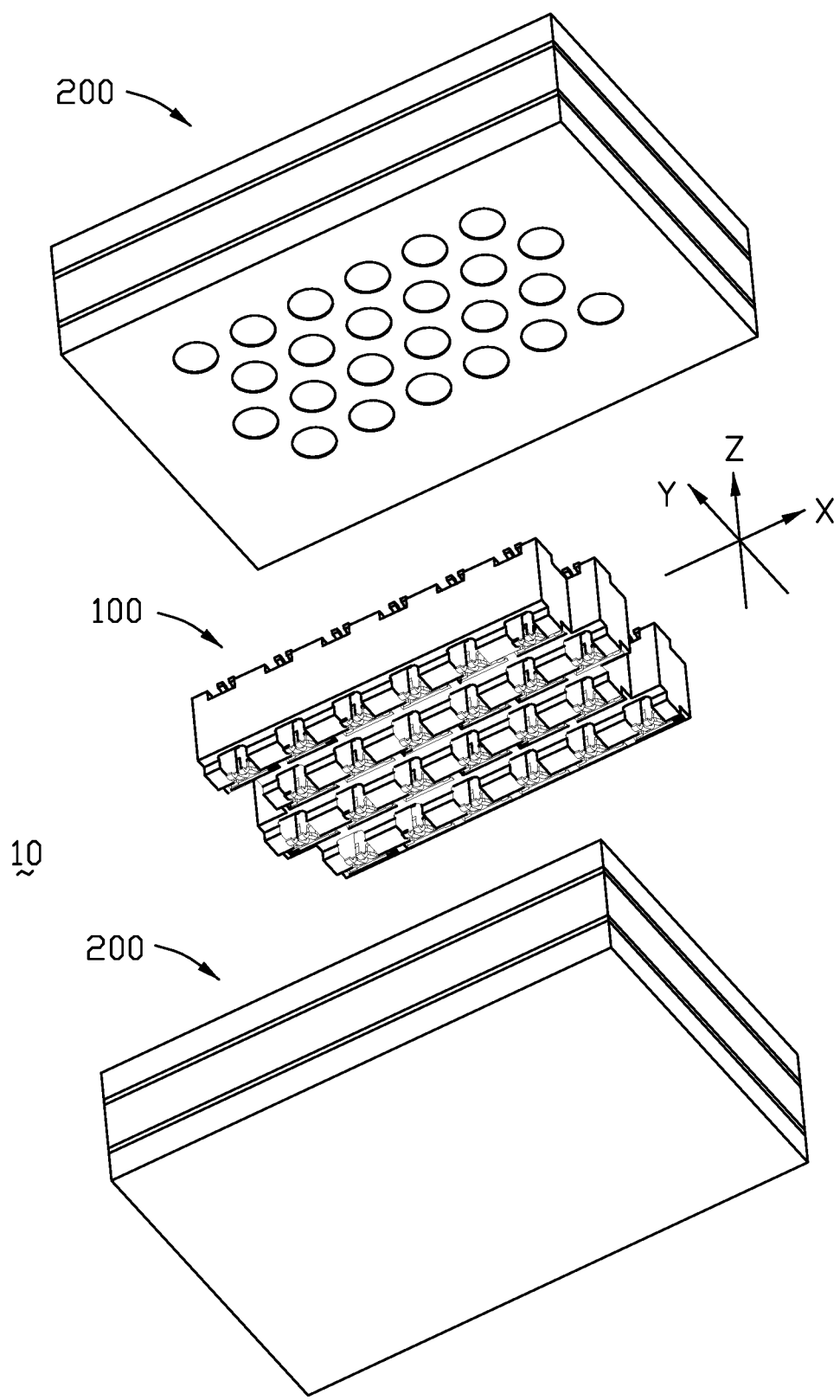
FIG. 6 is another exploded perspective view of the electrical connector assembly of FIG. 5.
Figure 7:
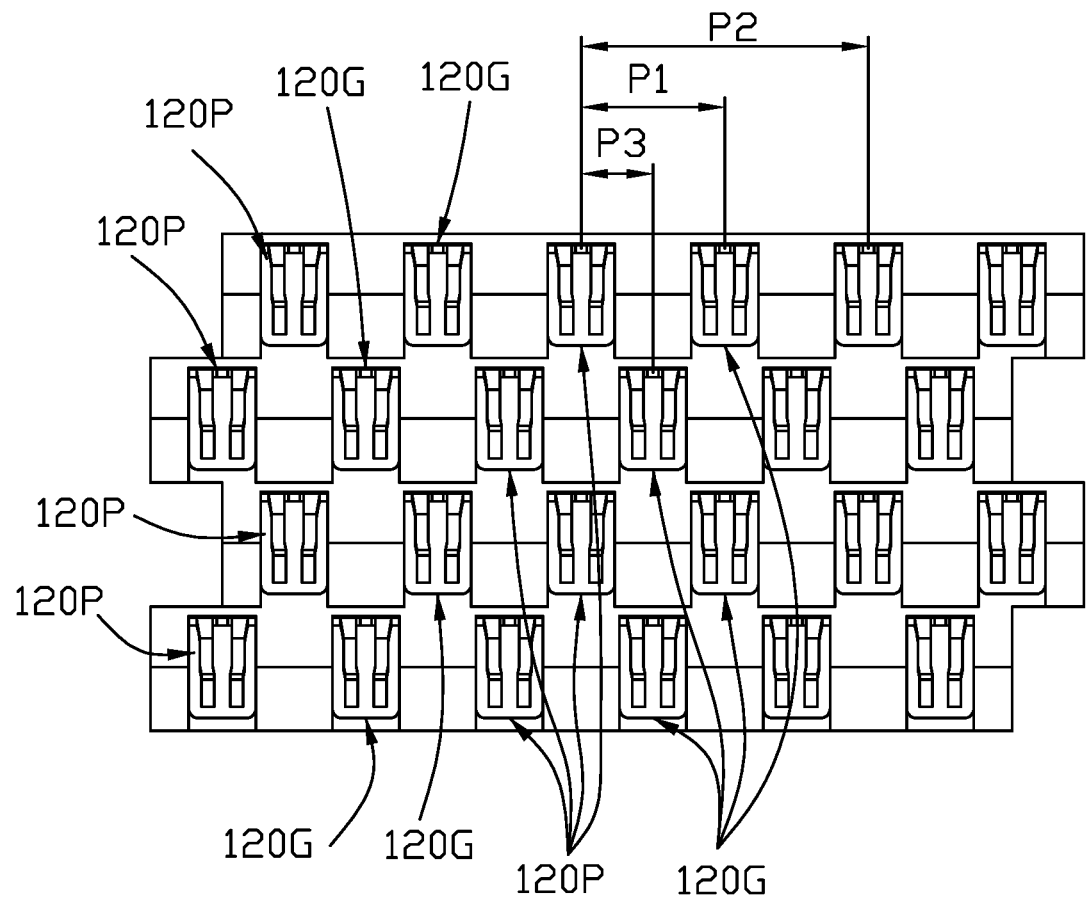
FIG. 7 is a top view of the electrical connector of FIG. 5.
Figure 8:
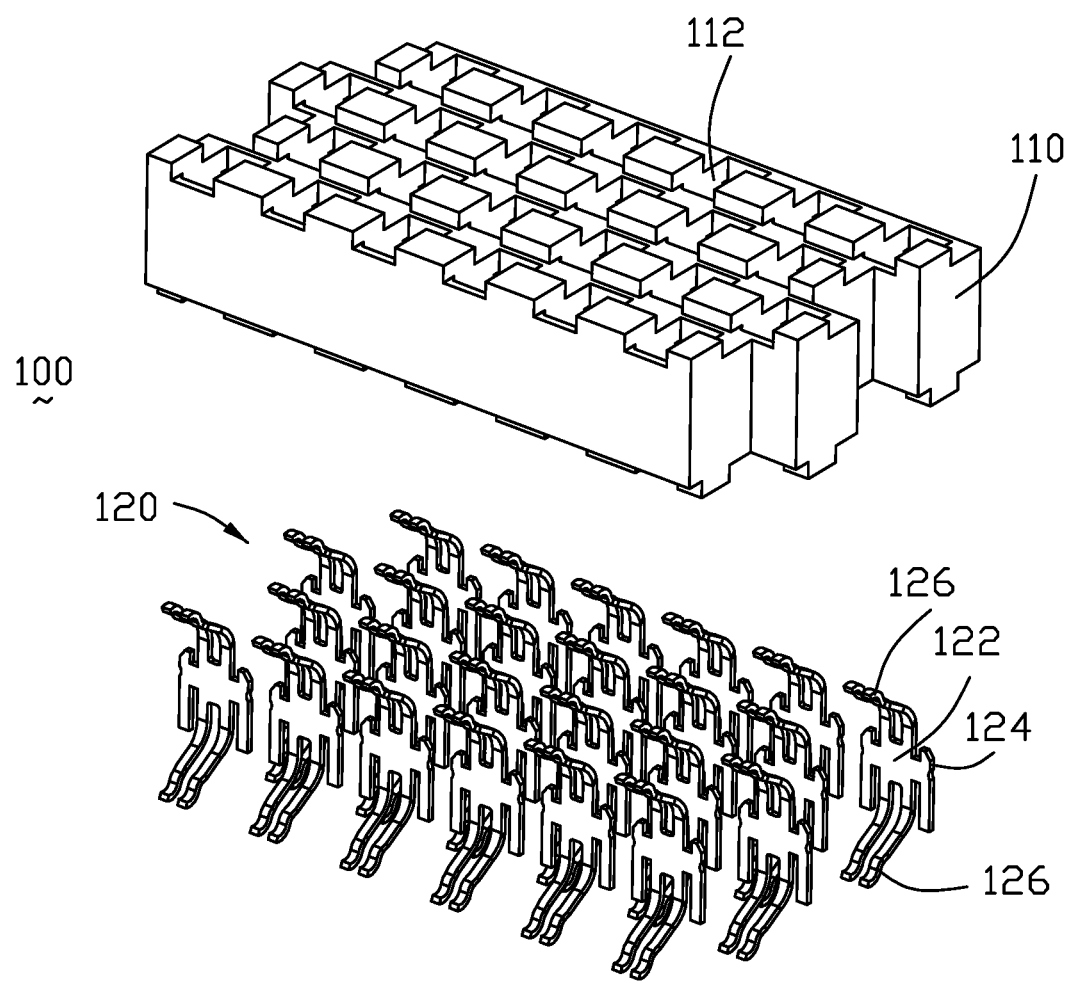
FIG. 8 is an exploded perspective view of an electrical connector of FIG. 7.
Figure 9:
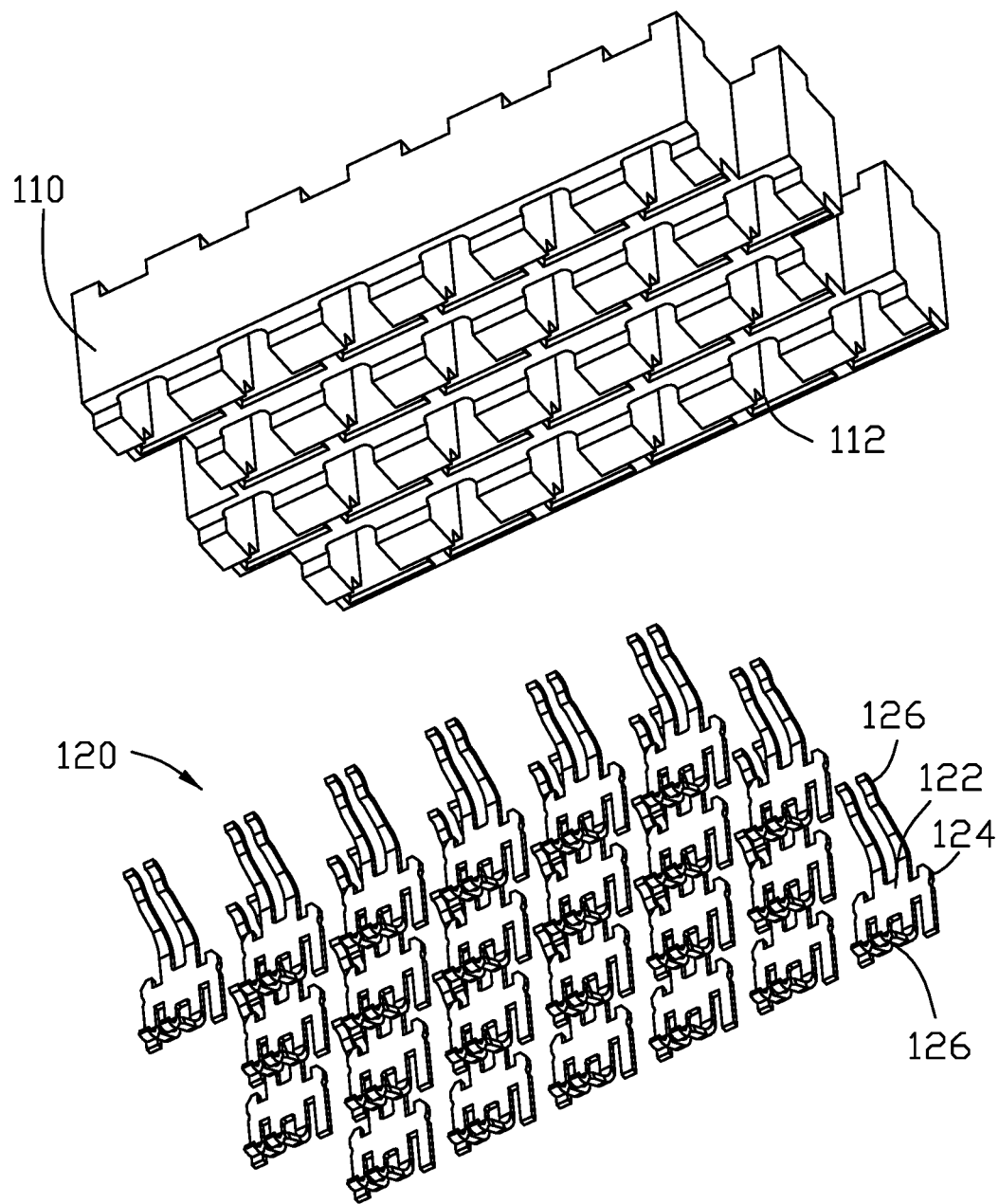
FIG. 9 is another exploded perspective view of electrical connector of FIG. 8.
Figure 10:
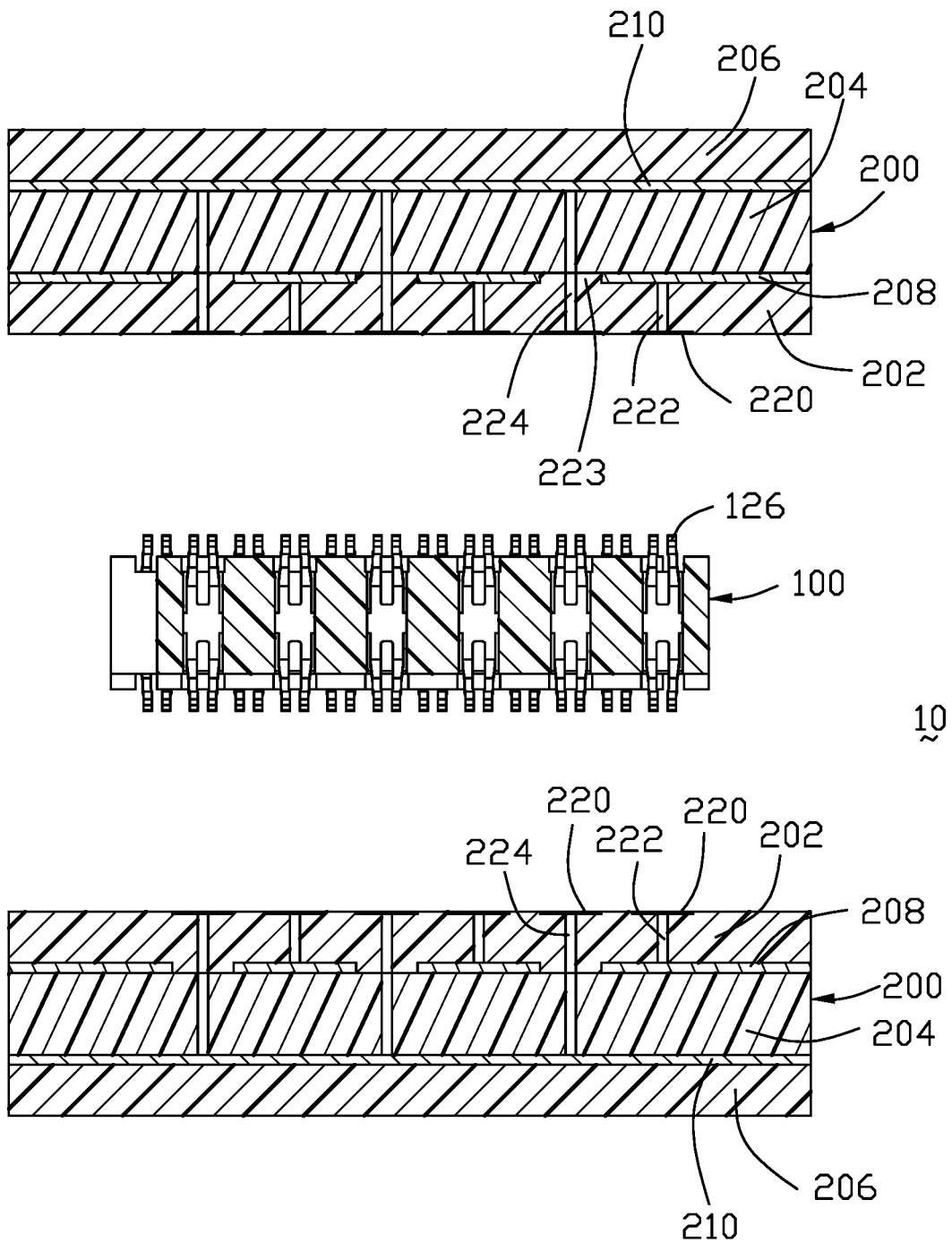
FIG. 10 is a cross-sectional view of the electrical connector assembly of FIG. 5.
Figure 11:
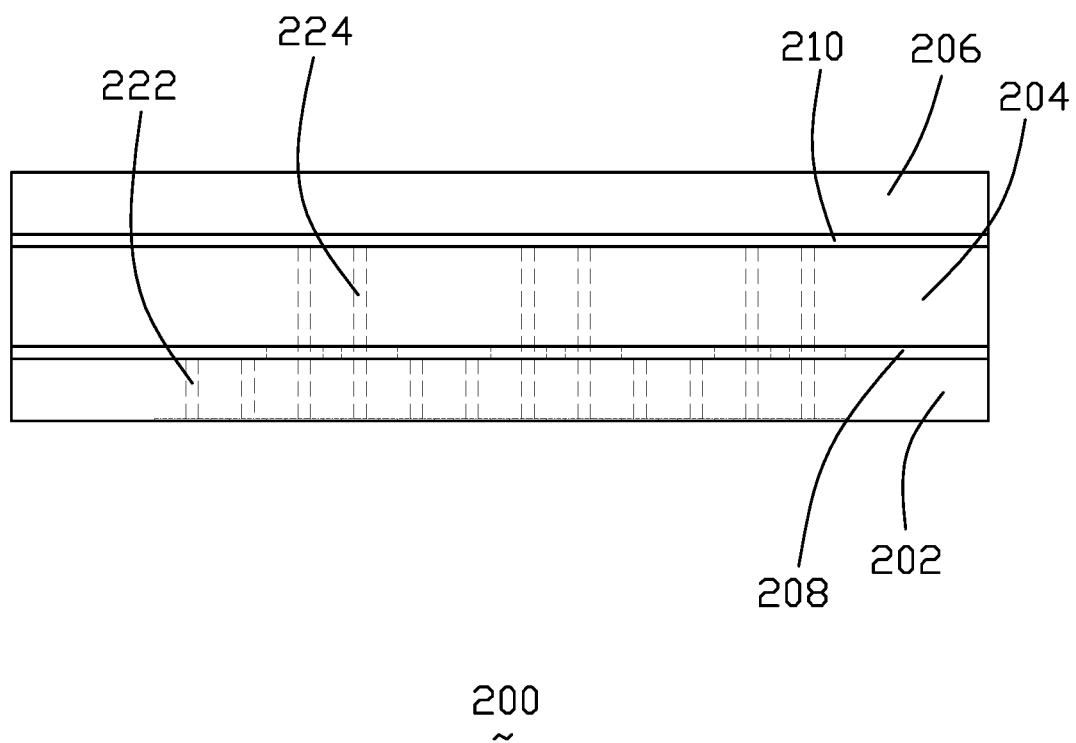
FIG. 11 shows the via arrangement in the printed circuit board of FIG. 1, viewed along a front-to-back direction.
Figure 12:
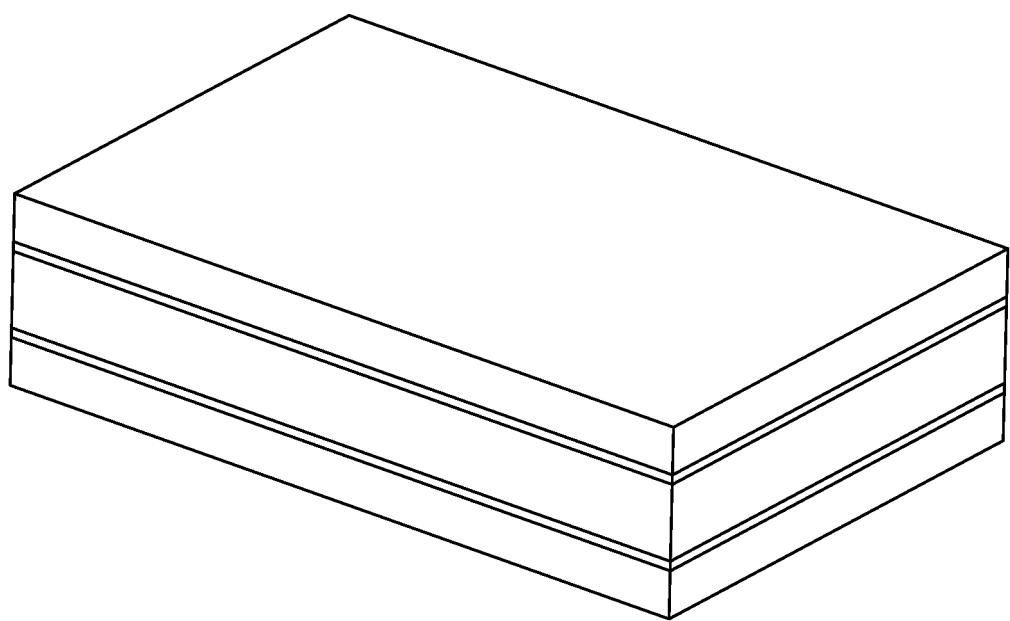
FIG. 12 is a perspective view of a printed circuit board of a preferred embodiment of the invention.
Figure 13:
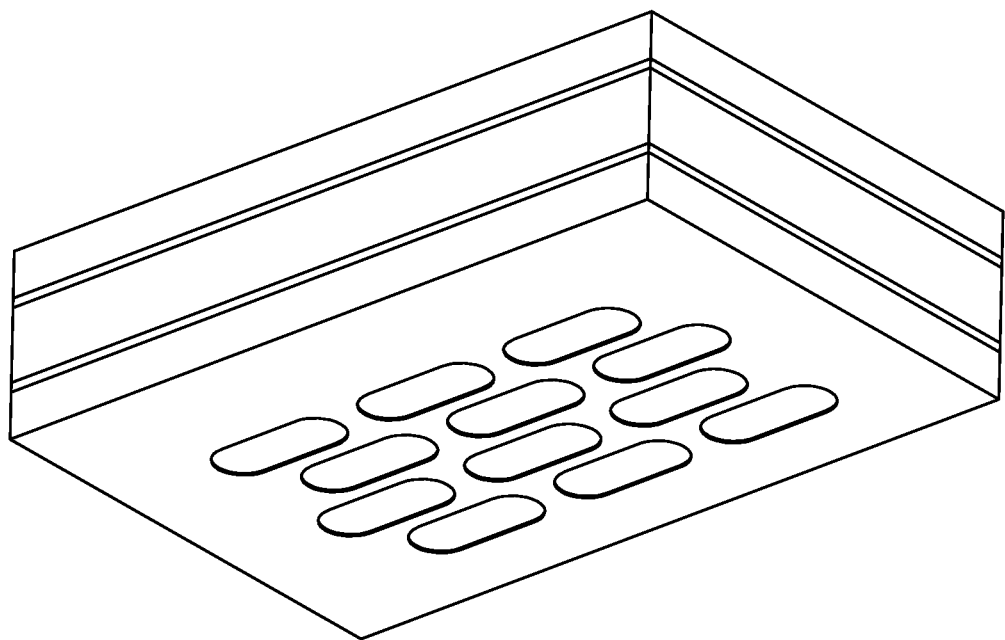
FIG. 13 is another perspective view of the printed circuit board of FIG. 12.
Figure 14:
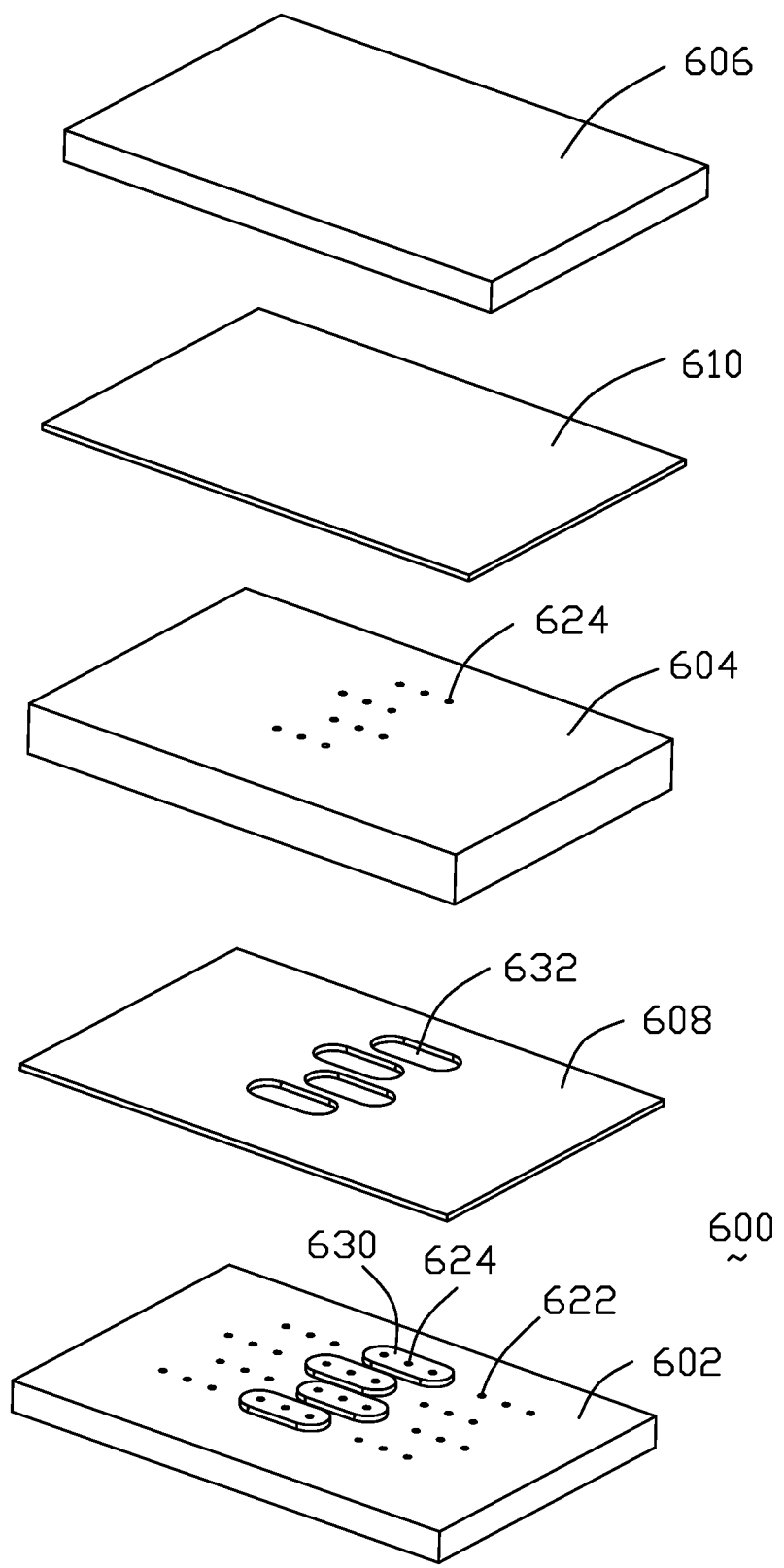
FIG. 14 is an exploded perspective view of the printed circuit board of FIG. 12.
Figure 15:
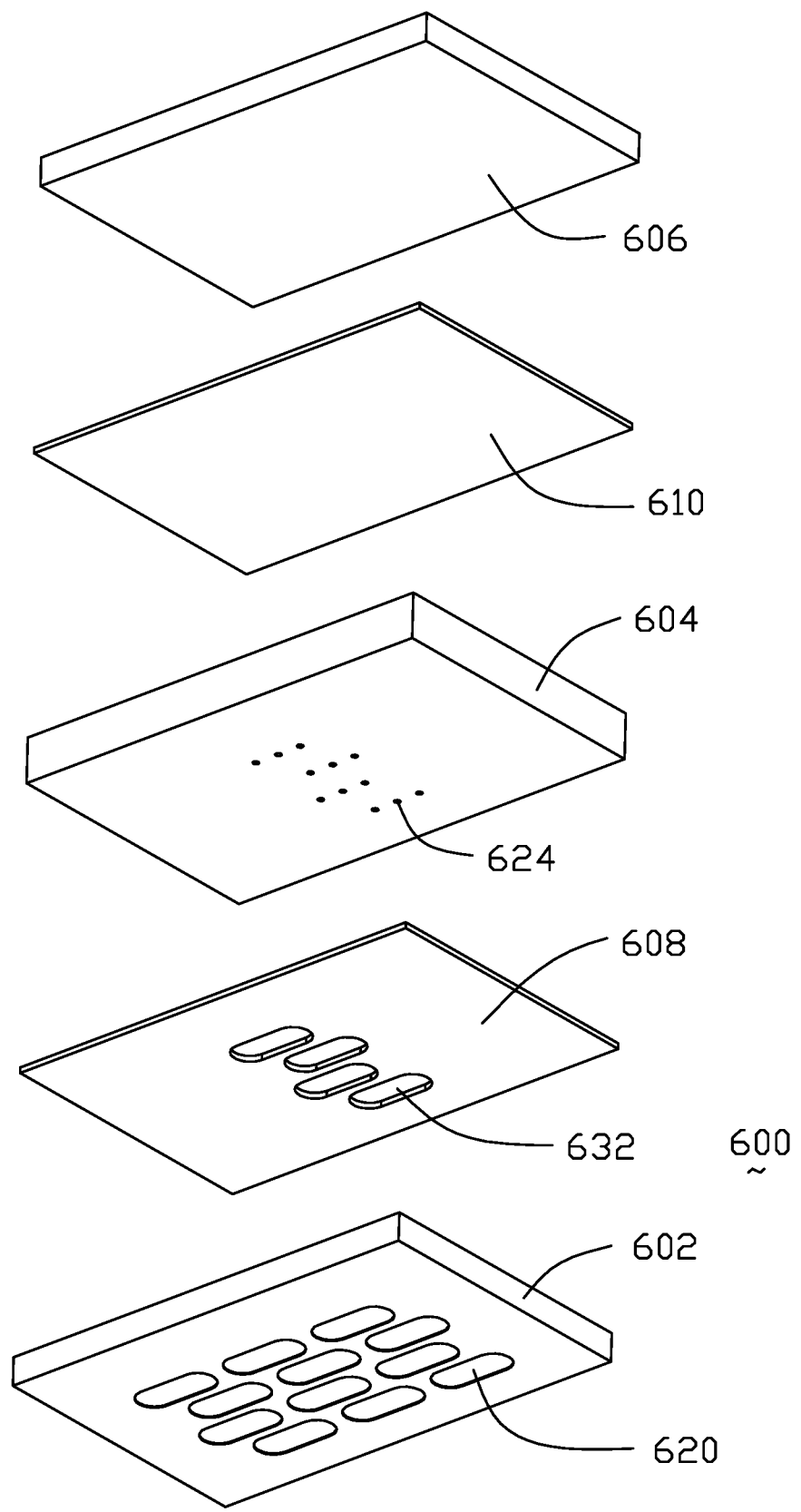
FIG. 15 is another exploded perspective view of the printed circuit board of FIG. 13.
Figure 16:
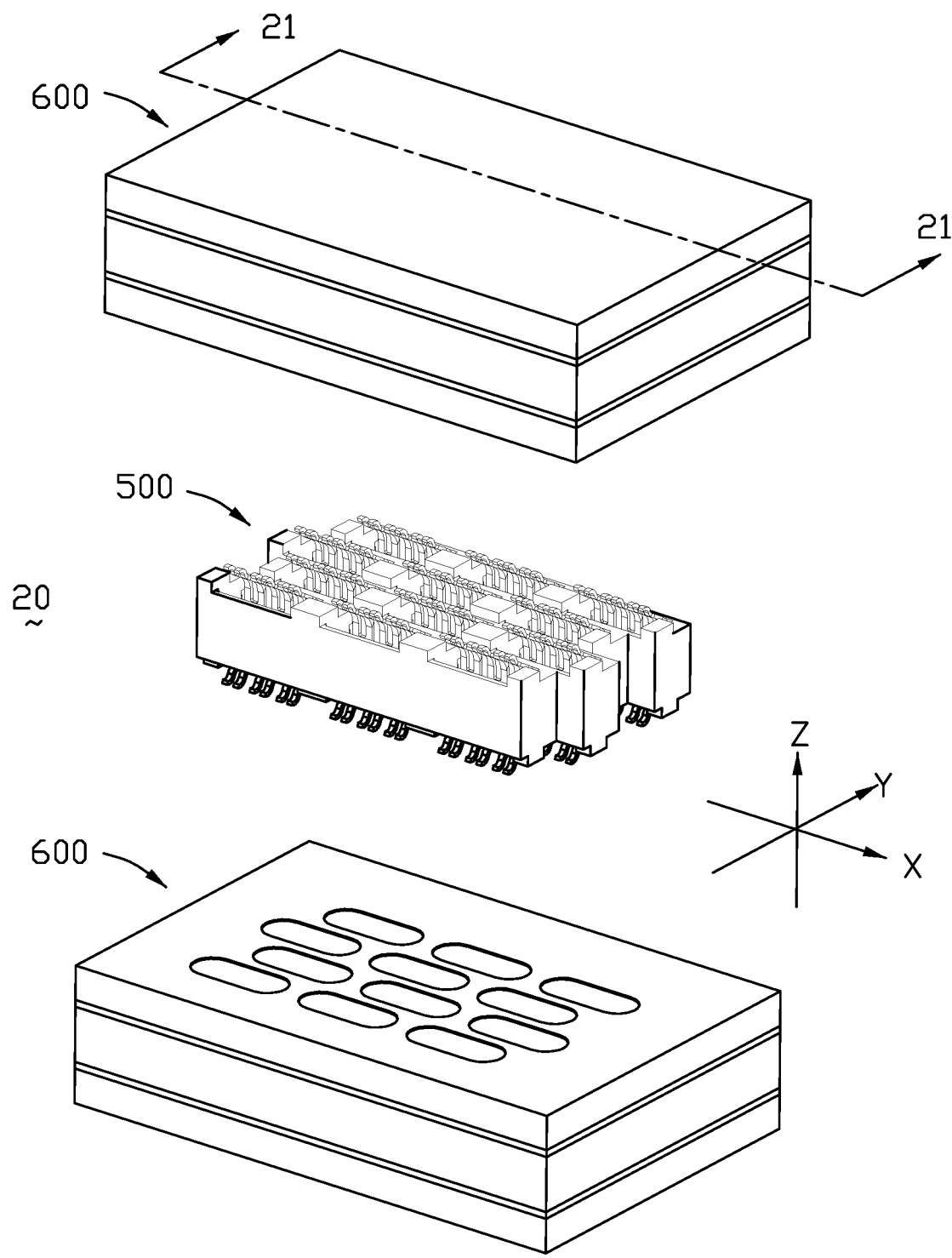
FIG. 16 is an exploded perspective view of the electrical connector assembly including two printed circuit boards of FIG. 12 with an electrical connector of the previous type sandwiched therebetween in the vertical direction.

Reference will now be made in detail to the embodiments of the present disclosure. The reference numerals are referred throughout to the different embodiments. The first embodiment is shown in FIGS. 12-22 related to the electrical connector assembly 20 which includes an electrical connector 500 sandwiched between a pair of printed circuit boards 600 which are opposite to each other in the vertical direction.

An electrical connector 500 includes an insulative housing 502 forming plural rows of passageways 504 wherein each row of passageways 504 extends along a front-to-back direction Y while the plural rows are spaced from one another in a transverse direction X perpendicular to the front-to-back direction Y. Each row of passageways 504 are arranged in a zigzag manner. Each passageway 504 is dimension to receive a unified contact 510 having a main body 512 with barbs 514 on two sides and three sets of spring arms 516 which are located at each of the opposite upper lower ends of the main body 512 and spaced from one another in the transverse direction X. The three sets of spring arms 516 are categorized with two outer sets and one inner set therebetween in the transverse direction X. Each set is of a dual-beam structure. The pitch P5 between the two neighboring sets of spring arms 516 of each unified contact 519 is essentially one half of the distance P6 between one outer set of spring arms 516 of one unified contact 510 and a closer outer set of spring arms 516 of the neighboring unified contact 510.

Similar to the previous type, the contacts include the power 510P and the grounding contacts 510G arranged in the corresponding alternate rows. The corresponding printed circuit board 600 includes five layer essentially composed of an inner/first insulative layer 602, a middle/second insulative layer 604 and an outer/third insulative layer 606 wherein a metallic/conductive Vbus layer 608 is sandwiched between the inner insulative layer 602 and the middle insulative layer 604, and a metallic/conductive grounding layer 610 is sandwiched between the middle insulative layer 604 and the outer insulative layer 606. Understandably, the inner insulative layer 602 is closer, to the connector 500, than the outer insulative layer 606. A plurality of conductive pads 620 are formed on an exterior surface of the inner insulative layer 602 corresponding to the contacts, a plurality of short vias 622 extend through the inner insulative layer 602 to connect the corresponding conductive pads 620 and the Vbus layer 608, and a plurality of long vias 624 extend through both the inner insulative layer 602 and the middle insulative layer 604 to connect the corresponding conductive pads 620 to the grounding layer 610. The metallic V-bus layer 608 forms a plurality of through holes 632 to receive the corresponding protrusions 630 formed on the inner insulative layer 602 or the middle insulative layer 604, through which the vias 624 extend.

Figure 17:
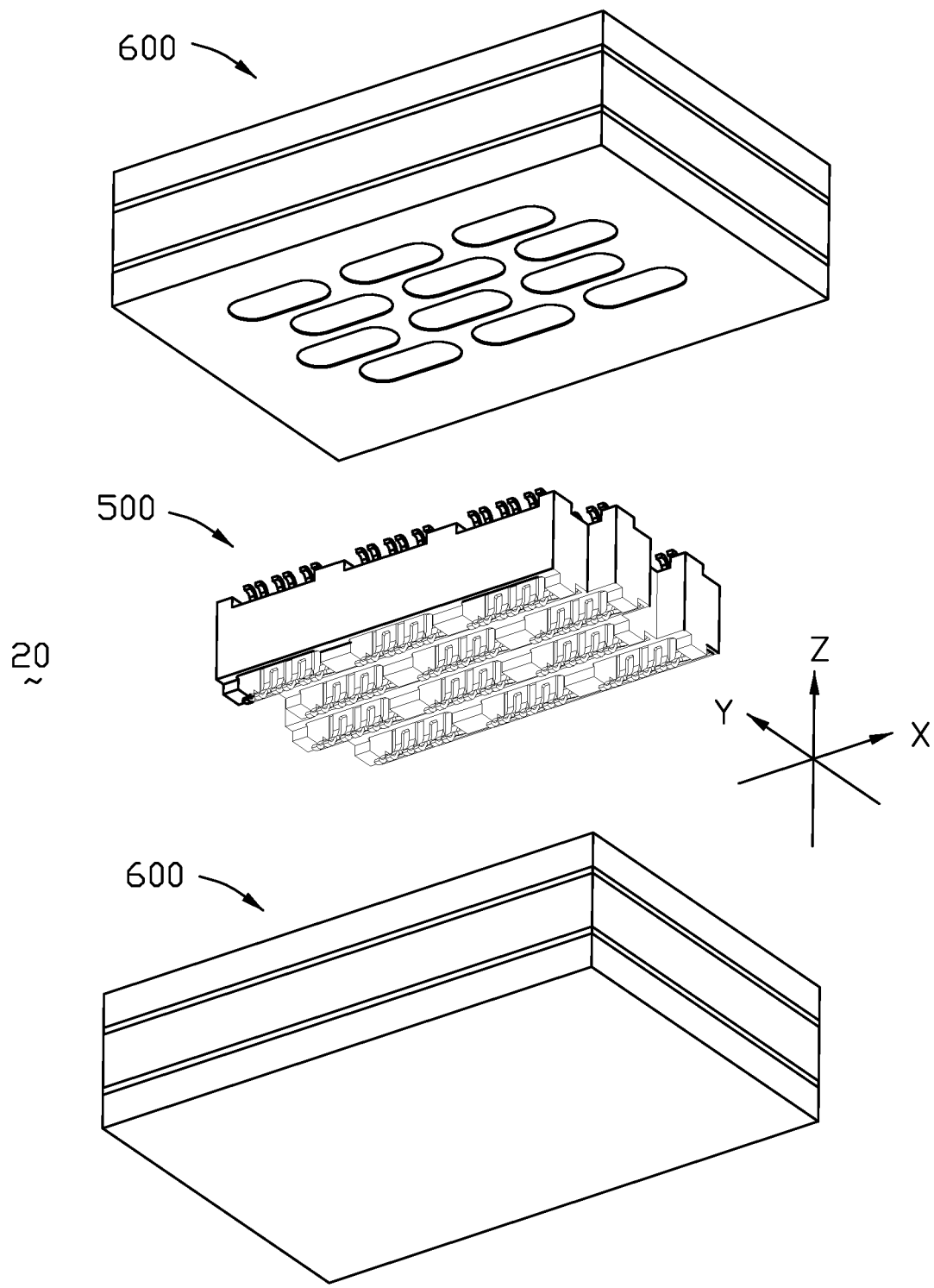
FIG. 17 is another exploded perspective view of the electrical connector assembly of FIG. 16.
Figure 18:
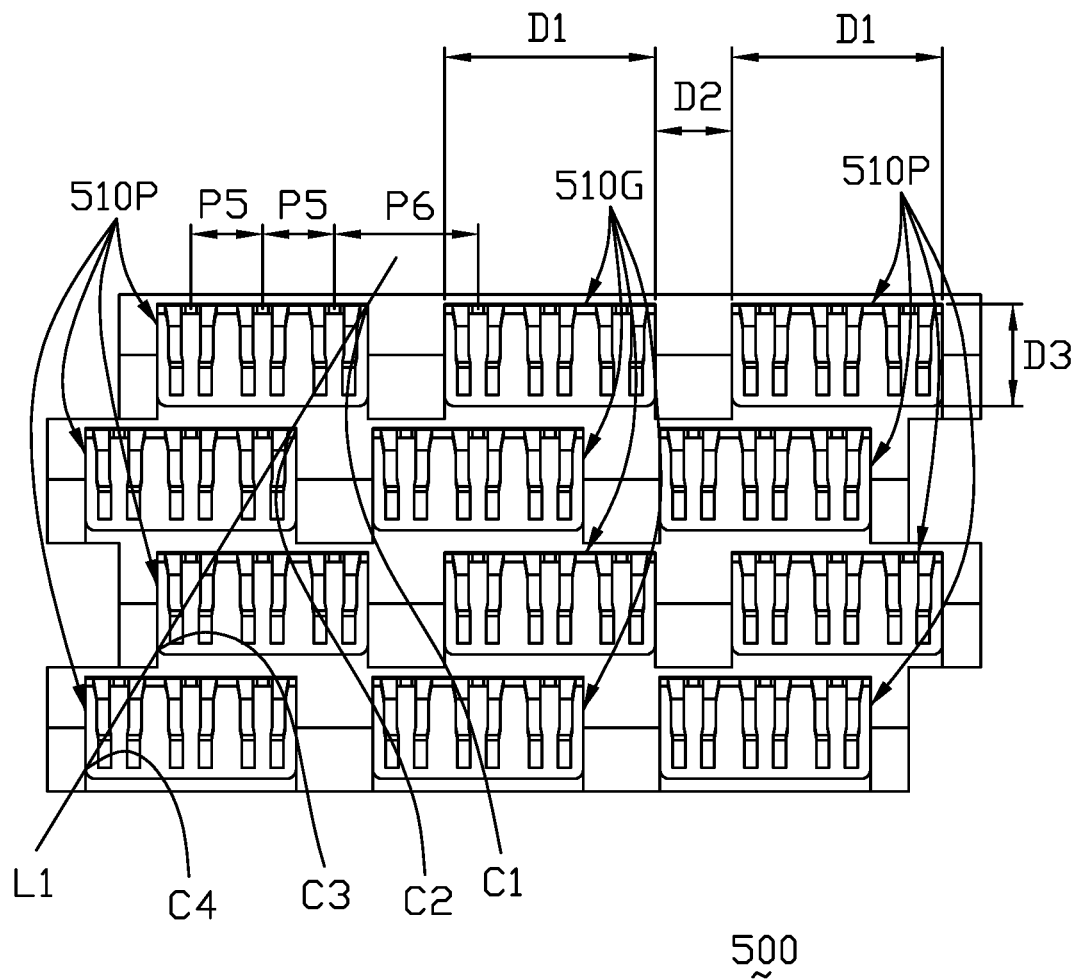
FIG. 18 is a top view of the electrical connector of FIG. 12.
Figure 19:
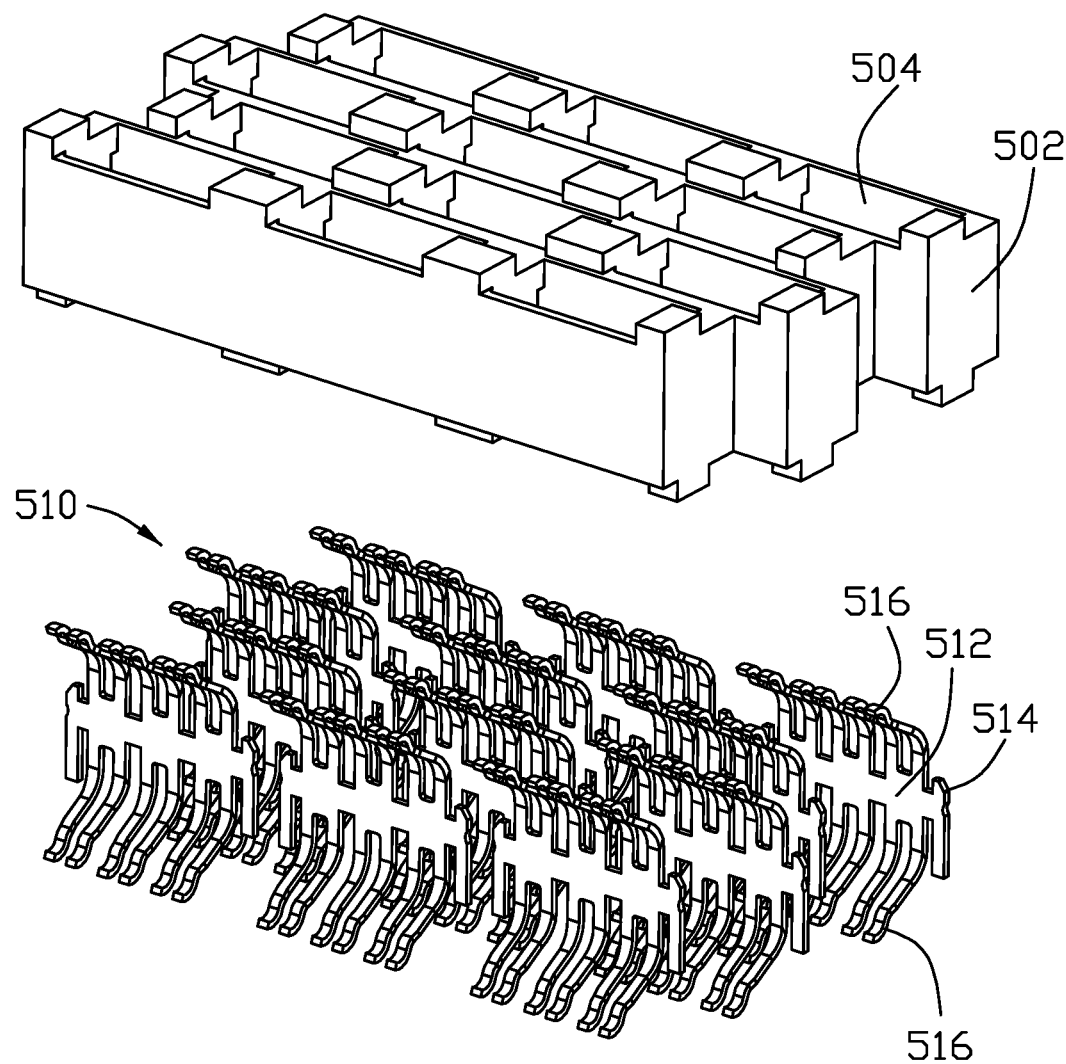
FIG. 19 is an exploded perspective view of an electrical connector of FIG. 18.
Figure 20:
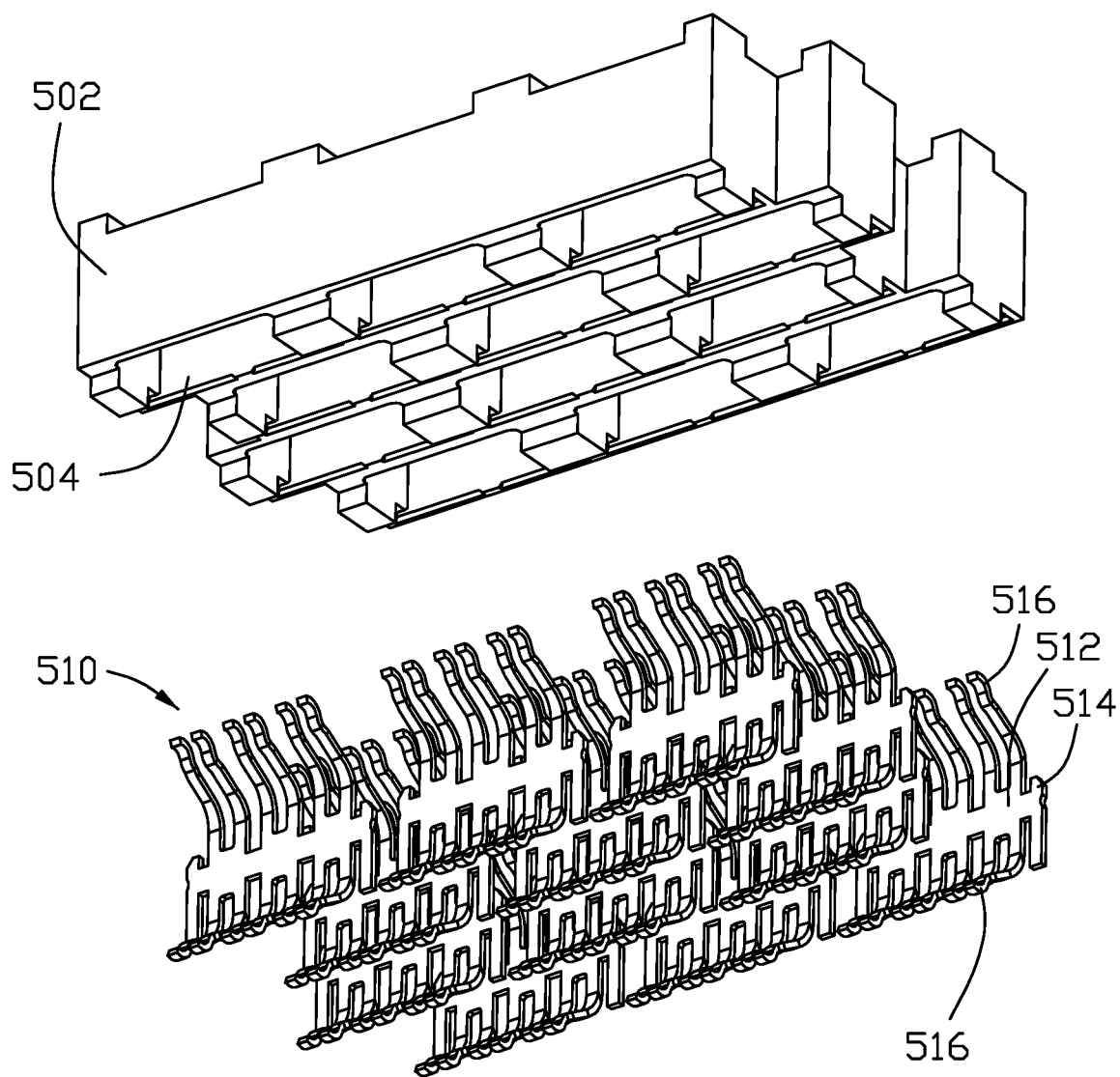
FIG. 20 is another exploded perspective view of electrical connector of FIG. 19.
Figure 21:
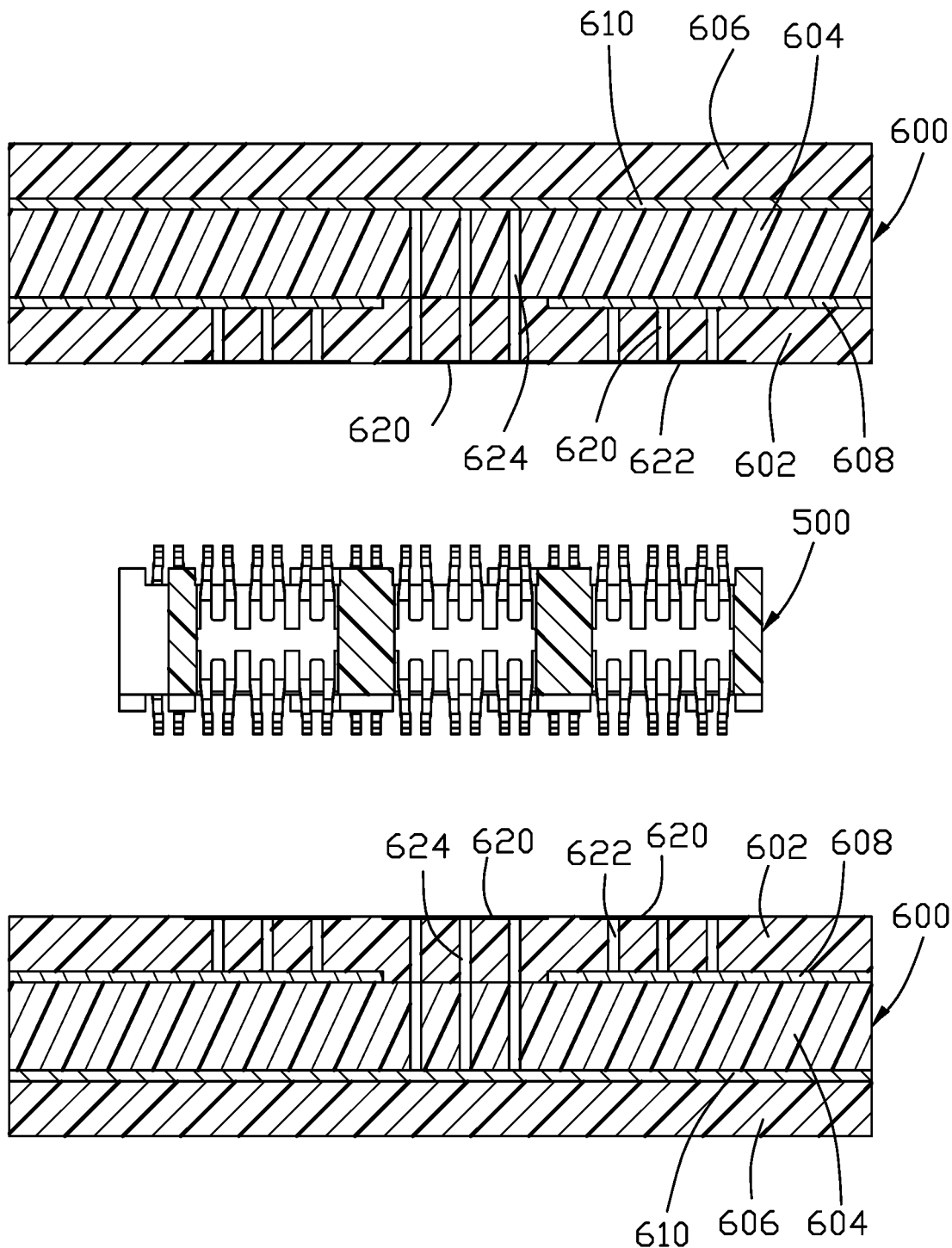
FIG. 21 is a cross-sectional view of the electrical connector assembly of FIG. 16.
Figure 22:
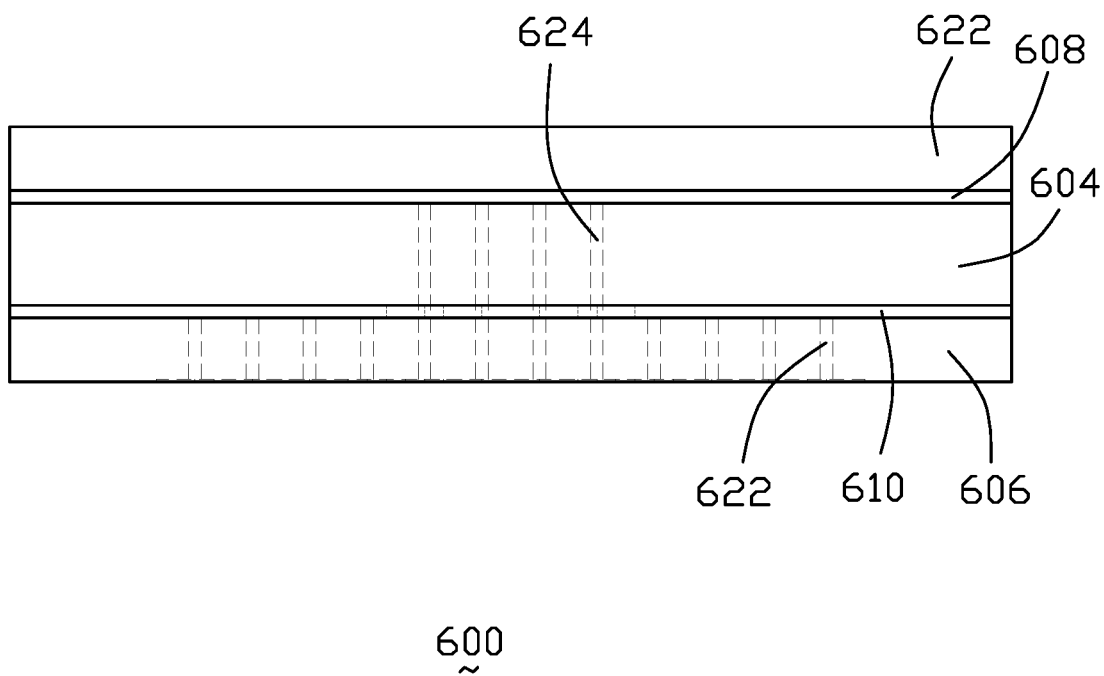
FIG. 22 shows the via arrangement in the printed circuit board of FIG. 12, viewed along a front-to-back direction.

Notably, such vias 624 enclosed in the protrusion 632, correspond to the conductive pad 620 connecting the grounding contact 510E Understandably, the upper printed circuit board 600 and the bottom printed circuit board 600 shown in FIG. 17 are arranged with mirror images to each other. As shown in FIG. 18, the dimension D1 of passageway 504 along the transverse direction X is three times of the dimension D2 of the dividing wall between two neighboring passageway 504 along the transverse direction. The dimension D3 of the passageway 504 along the front-to-back direction is around one half of the dimension D1.

Figure 23:
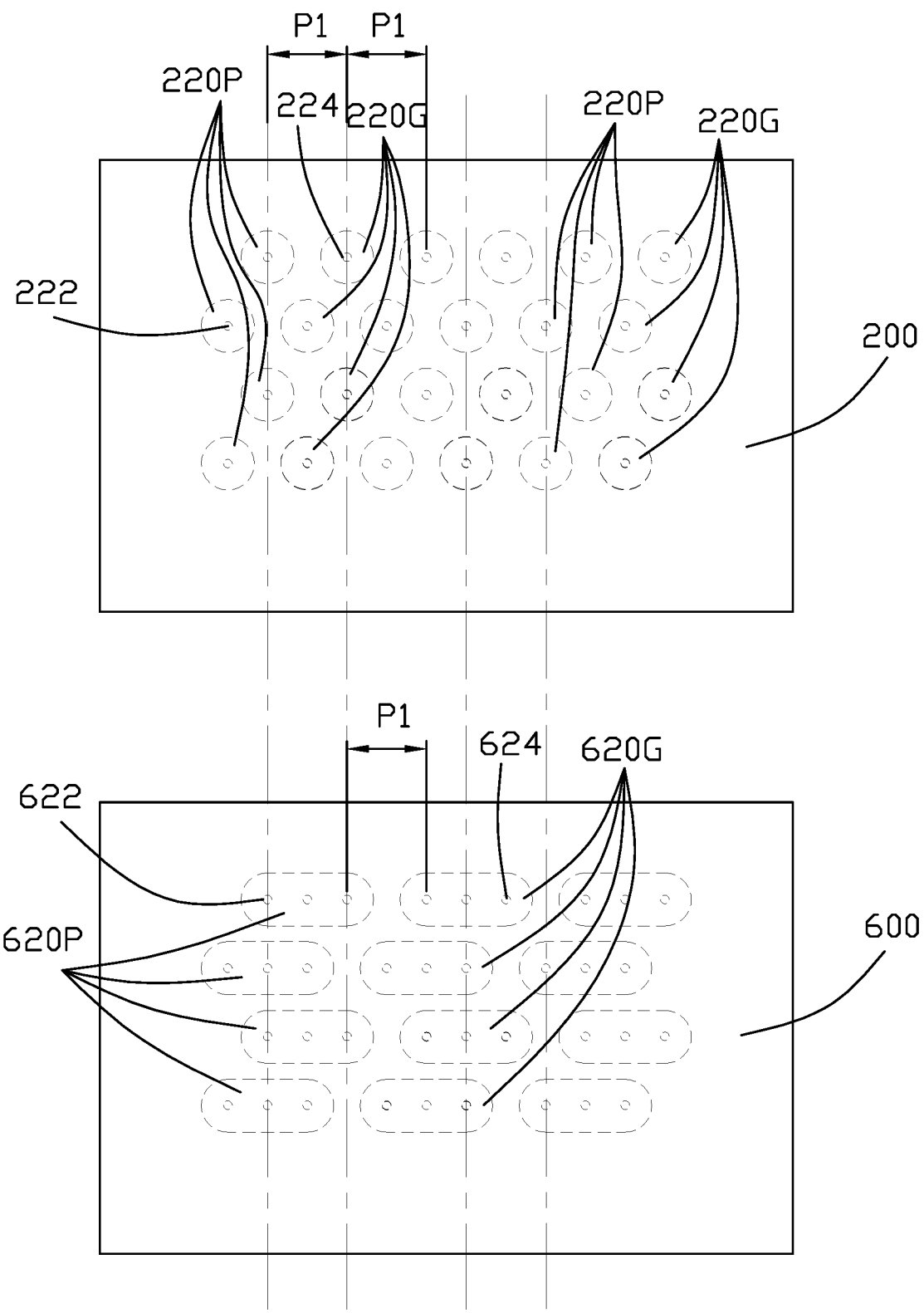
FIG. 23 is a diagram showing pitch comparison between the previous arrangement and the invention.

FIG. 23 shows the difference of the conductive pads 220 on the printed circuit board 200 in the previous design, i.e., the upper part, and the conductive pads 620 on the printed circuit board 600 of the invention, i.e., the lower part. In an overview, in the invention the two neighboring conductive pads 220 in the previous design are transversely joined together with an additional via formed between the original two vias 222 and 224. Understandably, the conductive pads 220 are categorized with the power pads 220P for contacting the power contact 120P and the grounding pads 220G for contacting the grounding contact 120G alternately arranged with each other in the transverse direction.

After this modification, i.e., converting the previous design to the invention, the conductive pad 620 is three times of the conductive pad 220 in the transverse direction, and each power pad 620P corresponds to three short vias 622 and each grounding pad 620G corresponds to three long vias 624. Notably, the additional/middle via for the conductive pad 620 also contributes to lower the contact resistance during operation. Notably, within the same sized region, in the previous design the printed circuit board 200 has six conductive pads arranged, along the transverse direction, with the power pad 620P, the grounding pad 620G the power pad 620P, the grounding pad 620G the power pad 620P and the grounding pad 620G while the invention only has the three enlarged conductive pads as the power pad 620P, the grounding pad 620G and the power pad 620P. This difference is also reflected on the connector 500 and the corresponding three-in-one unified contact 510.

Figure 24:
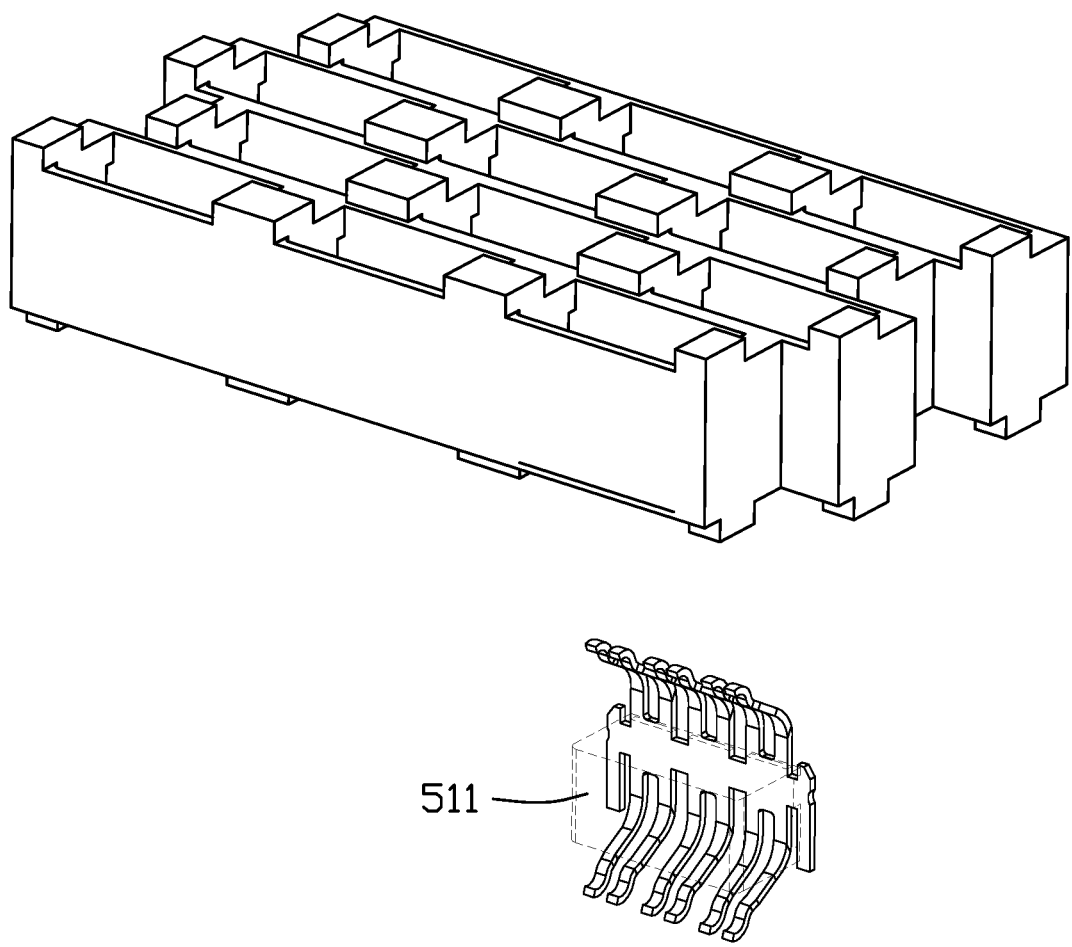
FIG. 24 is an exploded perspective view showing the contact module used within the connector housing according to another embodiment of the invention.

FIG. 24 shows another embodiment of the invention wherein each contact is firstly integrally formed with an insulator 511 (shown in the dashed lines) which is snugly compliant with an interior space of the passageway so as to reinforce the housing. Understandably, compared with the previous design, the first embodiment of the invention forms additional one half of voids/passageways which may lessen the strength of the housing. The second embodiment may compensate this side effect.

The feature of the invention includes the relative dimensions of the passageway in the transverse direction and in the front-to-back direction, and further the relative dimension of the space/distance between the neighboring passageways either in the front-to-back direction and the transverse direction so as to maximize usage of the limited sized housing for achieving the optimal electrical characteristics. For example, in this embodiment as shown in FIG. 18, among the four passageways in each row, the straight line L passes the upper right corner C1 of the first/uppermost passageway, the upper right corner C2 of the second/upper middle passageway, the lower left corner C3 of the third/lower middle passageway, and the lower left corner C4 of the fourth/lowermost passageway.

While a preferred embodiment in accordance with the present disclosure has been shown and described, equivalent modifications and changes known to persons skilled in the art according to the spirit of the present disclosure are considered within the scope of the present disclosure as described in the appended claims.

What is claimed is:

1. An electrical connector assembly comprising:
an electrical connector including an insulative housing sandwiched between two oppositely arranged printed circuit boards in a vertical direction; and
plural rows of passageways formed in the housing and spaced from one another in a transverse direction perpendicular to the vertical direction, while each row of passageways extends in a zigzag manner in a front-to-back direction perpendicular to both the vertical direction and the transverse direction; wherein
a distance (D2) in the transverse direction between the neighboring passageways in different rows, is essentially one third of a transverse dimension (D1) of each passageway in the transverse direction; wherein
a deviation of said zigzag manner in each row is around one third of the transverse dimension of the passageway in the transverse direction.

2. The electrical connector assembly as claimed in claim 1, further including a plurality of contacts respectively retained in the corresponding passageways, wherein each contact includes a main body with plural sets of spring arms located on both opposite ends in the vertical direction.

3. The electrical connector assembly as claimed in claim 2, wherein the contacts are categorized with power contacts arranged in rows and grounding contacts arranged in a row alternately arranged with the power contacts in the transverse direction.

4. The electrical connector assembly as claimed in claim 2, wherein each printed circuit board includes an inner insulative layer, a middle insulative layer, an outer insulative layer, a metallic Vbus layer sandwiched between the inner insulative layer and the middle insulative layer, and a metallic grounding layer sandwiched the middle insulative layer and the outer insulative layer in the vertical direction, said inner insulative layer being closer to the connector than the outer insulative layer.

5. The electrical connector assembly as claimed in claim 4, wherein a plurality of conductive pads are formed on an exterior surface of the inner insulative layer to respectively connect to the corresponding contacts, a plurality of short vias extending through the inner insulative layer in the vertical direction to connect the corresponding conductive pads and the Vbus layer, and a plurality of long vias extending through both the inner insulative layer and the middle insulative layer to connect the corresponding conductive pads and the grounding layer.

6. The electrical connector assembly as claimed in claim 5, wherein the V-bus layer forms a plurality of through holes to receive a protrusion formed on either the inner insulative layer or the middle insulative layer.

7. The electrical connector assembly as claimed in claim 5, wherein each conductive pad connects to a plurality of short vias or a plurality of long vias.

8. The electrical connector as claimed in claim 2, wherein each contact includes three sets of spring arms and each set includes a pair of spring arms.

9. The electrical connector assembly as claimed in claim 2, wherein each spring arm extends in the front-to-back direction in a top view taken along the vertical direction.

10. The electrical connector assembly as claimed in claim 1, wherein the passage in one row is not overlapped, in the front-to-back direction, with the passageway in a neighboring row.

11. The electrical connector assembly as claimed in claim 1, wherein a dimension of each passageway in the front-to-back direction is around one half of another dimension of each passageway in the transverse direction.

12. An electrical connector assembly comprising:
at least one printed circuit board including an inner insulative layer and an outer insulative layer with a middle insulator layer therebetween in a vertical direction, a metallic Vbus layer being sandwiched between the inner insulative layer and the middle insulative layer in the vertical direction, and a metallic grounding layer being sandwiched between the middle insulative layer and the outer insulative layer in the vertical direction, a plurality of conductive pads formed on an exterior surface of the inner insulative layer to electrically connect with the corresponding metallic Vbus layer or metallic grounding layer;
an electrical connector, which is closer to the inner insulative layer than to the outer insulative layer in the vertical direction, including an insulative housing with plural rows of passageways spaced from one another in a transverse direction perpendicular to the vertical direction, each passageway extending though the housing in said vertical direction, each row extending, in a zigzag manner, along a front-to-back direction perpendicular to both the vertical direction and the transverse direction; and plural rows of contacts respectively received within the corresponding passageways, and including power contacts arranged in rows, and grounding contacts arranged in at least one row so as to have the power contacts and the grounding contacts alternately arranged with each other in the transverse direction;

wherein each passageway defines a dimension (D3) in the front-to-back direction which is around one half of another dimension (D1) thereof in the transverse direction.

13. The electrical connector assembly as claimed in claim 12, wherein the passageway in one row is not overlapped, in the front-to-back direction, with another the passageway in the neighboring row.

14. The electrical connector assembly as claimed in claim 12, wherein in each row, two thirds of a dimension of each passageway in the transverse direction is overlapped, in the front-to-back direction, with the neighboring passageway.

15. The electrical connector assembly as claimed in claim 12, wherein each contact has a main body with three sets of spring arms extending from each of opposite upper and lower ends thereof, and each spring arm extends in the front-to-back direction in a top view taken along the vertical direction.

16. The electrical connector assembly as claimed in claim 15, wherein each set of spring arms has a pair of spring arms.

17. The electrical connector assembly as claimed in claim 12, wherein a space between two neighboring passageways in the transverse direction is around one third of a dimension of the passageway in the transverse direction.

18. An electrical connector assembly comprising:

an electrical connector adapted to be sandwiched between two oppositely arranged printed circuit boards in a vertical direction; and plural rows of passageways formed in the housing and spaced from one another in a transverse direction perpendicular to the vertical direction, while each row of passageways extends in a zigzag manner in a front-to-back direction perpendicular to both the vertical direction and the transverse direction, each passageway defining a rectangular configuration in a top view taken along the vertical direction; wherein in said top view, each row of passageway includes at least four neighboring passageways among which a straight line sequentially passes an upper right corner of the rectangular configuration of an uppermost passageway, an upper right corner of the rectangular configuration of an upper middle passageway, a lower left corner of the rectangular configuration of a lower middle passageway, and a lower left corner of the rectangular configuration of a lowermost passageway; wherein in each row, each of the four neighboring passageways has two thirds of a transverse dimension overlapped and aligned together in the front-to-back direction.

19. The electrical connector assembly as claimed in claim 18, wherein the passageway in one row is not overlapped, in the front-to-back direction, with another passageway in the neighboring row.

* * * * *